US011639966B2

(12) United States Patent
Pamulaparthy et al.

(10) Patent No.: US 11,639,966 B2
(45) Date of Patent: May 2, 2023

(54) ENHANCED ELECTRICAL SIGNATURE ANALYSIS FOR FAULT DETECTION

(71) Applicant: GENERAL ELECTRIC TECHNOLOGY GMBH, Baden (CH)

(72) Inventors: Balakrishna Pamulaparthy, Hyderabad (IN); Mitalkumar Kanabar, Markham (CA); Akilezkrishnamurthy Arthanari, Markham (CA)

(73) Assignee: General Electric Technology GmbH, Baden (CH)

( * ) Notice: Subject to any disclaimer, the term of this patent is extended or adjusted under 35 U.S.C. 154(b) by 145 days.

(21) Appl. No.: 17/201,563

(22) Filed: Mar. 15, 2021

(65) Prior Publication Data

US 2022/0291285 A1 Sep. 15, 2022

(51) Int. Cl.
*G01R 31/34* (2020.01)
*G06N 20/00* (2019.01)
*G01N 25/72* (2006.01)

(52) U.S. Cl.
CPC .......... *G01R 31/343* (2013.01); *G01N 25/72* (2013.01); *G06N 20/00* (2019.01)

(58) Field of Classification Search
CPC ....... G01R 31/343; G01N 25/72; G06N 20/00
See application file for complete search history.

(56) References Cited

U.S. PATENT DOCUMENTS

| 5,680,025 | A  | 10/1997 | Bowers et al. |
| 6,308,140 | B1 | 10/2001 | Dowling et al. |
| 6,727,725 | B2 | 4/2004 | Devaney et al. |
| 6,774,601 | B2 | 8/2004 | Schwartz et al. |
| 6,941,785 | B2 | 9/2005 | Haynes et al. |
| 7,081,760 | B2 | 7/2006 | Mirafzal et al. |
| 7,099,852 | B2 | 8/2006 | Unsworth et al. |
| 7,346,475 | B2 | 3/2008 | Dimino et al. |
| 8,135,551 | B2 | 3/2012 | Tiwari et al. |

(Continued)

FOREIGN PATENT DOCUMENTS

| EP | 2743669 A1   | 6/2014 |
| EP | 3068040 A1   | 9/2016 |
| WO | 2015047121 A1 | 4/2015 |

OTHER PUBLICATIONS

Extended European Search Report issued in EP Application No. 22161845.7 dated Aug. 3, 2022, 12 pages.

(Continued)

*Primary Examiner* — Roy Y Yi
*Assistant Examiner* — Geoffrey T Evans
(74) *Attorney, Agent, or Firm* — Eversheds Sutherland (US) LLP (57) ABSTRACT

Systems, methods, and computer-readable media are disclosed for enhanced electrical signature analysis (ESA) for fault detection in electrical machines. The enhanced ESA uses an algorithm that is able to adaptively learn the behavior of a particular electrical machine and automatically establish fault thresholds for the electrical machine without requiring manual inputs from an operator. The particular algorithm described herein to accomplish this may use machine learning that may be used to model the behavior of the electrical machine in real-time and based on any properties specific to the electrical machine.

18 Claims, 7 Drawing Sheets

(56) References Cited

U.S. PATENT DOCUMENTS

| | | |
|---|---|---|
| 8,994,359 B2 | 3/2015 | Neti et al. |
| 9,217,775 B2 | 12/2015 | Mousavi et al. |
| 9,618,583 B2 | 4/2017 | Liu |
| 2014/0303913 A1 | 10/2014 | Neti et al. |
| 2016/0282416 A1 | 9/2016 | Choi |
| 2018/0246506 A1* | 8/2018 | Neti .................. G05B 23/0232 |

OTHER PUBLICATIONS

Balakrishna et al.: An Autonomous Electrical Signature Analysis-Based Method for Faults Monitoring in Industrial Motors. IEEE Transactions on Instrumentation and Measurement 70 (2021): 1-8.

Bowers et al.: Proactive Motor Monitoring. Knowledge Base Article, Dec. 27, 2010 (Dec. 27, 2010), pp. 1-29, XP055945571, Article ID: NK-1000-0675 Retrieved from the Internet: URL:https://www.scribd.com/document/394760783/Proactive-Motor-Monitoring [retrieved on Jul. 22, 2022].

* cited by examiner

ENHANCED ELECTRICAL SIGNATURE ANALYSIS FOR FAULT DETECTION

TECHNICAL FIELD

The disclosure relates to power systems, and, more particularly to, systems and methods for providing enhanced electrical signature analysis for fault detection.

BACKGROUND

With the current electrical signature analysis (ESA), it may be difficult to detect faults in certain types of electrical machines (for example, variable frequency drive (VFD) motors) due to these types of electrical machines having varying operating frequencies. It may also be difficult for an operator to manually establish fault thresholds for each of the types of faults associated with the electrical machine (for example, bearing, mechanical and stator faults). No guidelines or standards are available with respect to ESA to configure thresholds for these various faults. Therefore, setting the thresholds for each individual electrical machine type in a fleet of electrical machines may be a cumbersome task. The established thresholds must be in uniform range irrespective of the type of electrical machine, application, and site conditions. Furthermore, ESA must be more sensitive for fault detection based on motor condition deterioration and application when variable drive speed (VDS) motors are involved. Thus, current ESA methods may be insufficient and/or inefficient at detecting faults in VFD motors (as well as some other types of electrical machines and some special types of loads on machines having oscillations).

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

This disclosure may relate to, among other things, enhanced electrical signature analysis (ESA) for fault detection in electrical machines. An electrical machine may be, for example, an induction or synchronous motor, as well as any other type of electrical machine. In some cases, the enhanced ESA may specifically benefit fault detection in variable frequency drive (VFD) motors (however, the same can be applied to other types of electrical machines and those machines with loads having oscillations as well). With certain types of electrical machines (for example, variable frequency drive (VFD) motors), prior ESA methods may have difficulty in detecting faults because the VFD may operate at varying frequencies. It may also be difficult for an operator to manually establish fault thresholds to be used for fault detection in such machines (for example, bearing, mechanical and stator faults, to name a few examples). Hence, it may be beneficial to employ an algorithm that is able to adaptively learn the behavior of a particular electrical machine and automatically establish fault thresholds for the electrical machine without requiring manual inputs from an operator. The particular algorithm described herein to accomplish this may use machine learning that may be used to model the behavior of the electrical machine in real-time and based on any properties specific to the electrical machine. In some instances, modeling the behavior of the electrical machine may involve establishing one or more clusters of baseline data associated with a "healthy" operation of the electrical machine (for example, the operation of the electrical machine when it is not experiencing a fault). In such instances, the type of machine learning may include any clustering based technique, such as Mahalanobis distance (MD) (FIG. 5 may provide a more detailed illustration of the clustering accomplished using Mahalanobis distance clustering). Typically, however, machine learning algorithms may be computationally intensive and may require a substantial amount of input data to produce an output. The algorithm described herein may be implemented on an embedded device in a power system (for example, a protection relay in a power system including the electrical machine) that may not be capable of storing a substantial amount of data, however. To account for this, the algorithm may build the machine learning model incrementally using real-time data rather than relying on stored historical data.

Figure 5:
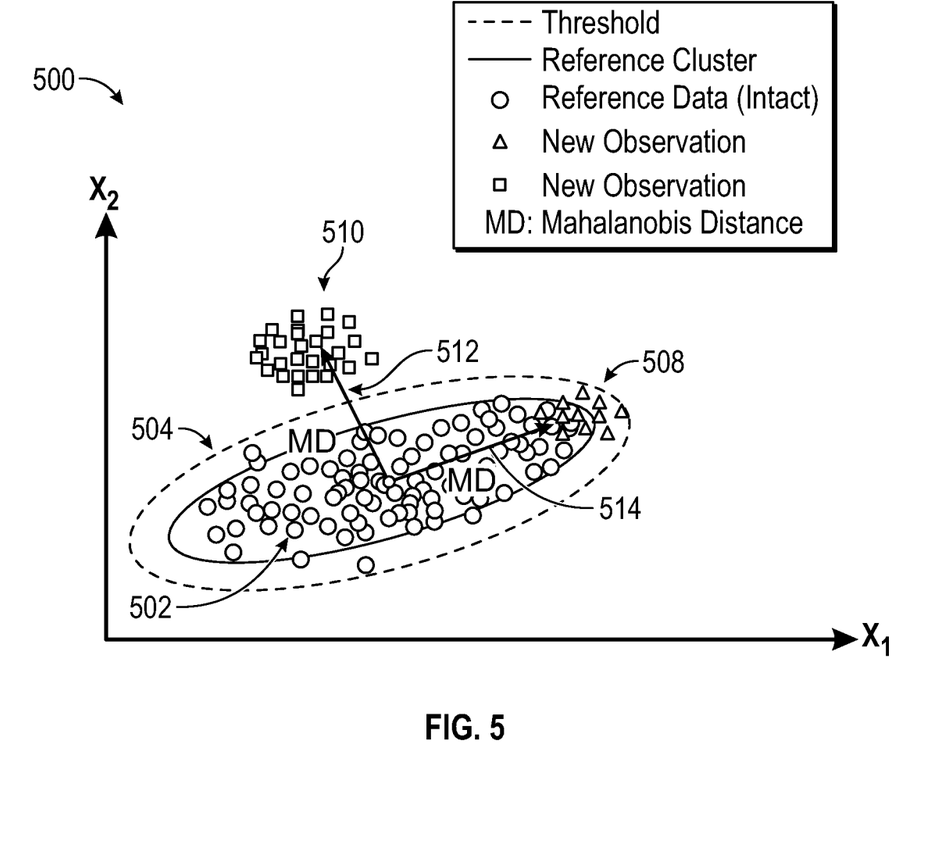
FIG. 5 depicts an example cluster plot, in accordance with one or more example embodiments of the disclosure.

In some embodiments, the algorithm may more specifically involve an approach of electrical machine fault diagnosis by deriving machine fault indicators (for example, peak and energy decibel (dB) values based on data captured from the electrical machine (for example, frequency spectrum, temperature data from different sub-systems of machine, and computed electrical data such as current unbalance, rate of change in current frequency, power factor, etc.). The data may be captured by a protection relay (or any intelligent electronic device or edge device) on which the algorithm may be implemented. The data may be captured in the time domain, but may be converted to the frequency domain for analysis. In some cases, the conversion of the data from the time domain to the frequency domain may be performed using a Fast Fourier transform (FFT), or any other suitable method. Once the data from the electrical machine is converted to the frequency domain, the algorithm may involve performing baselining to establish one or more baseline thresholds for different types of faults that the electrical machine may experience (as mentioned above, these baselines may include data clusters as depicted in FIG. 5, for example). The baselining may be performed incrementally or adaptively based on real-time data capture. Once the baselining is completed, the algorithm may transition to a monitoring mode in which data produced by the electrical machine may be compared to the one or more baseline thresholds established during the baselining mode to identify if a certain type of fault exists in the electrical machine.

During the baselining mode of operation, the healthy behavior of the electrical machine may be characterized for a particular operating condition of the electrical machine. The operating condition may refer to load, frequency, voltage/current unbalance, etc., for example. Data may be captured during the monitoring mode of operation described below under the same or similar operating conditions to allow for a comparison between the data obtained during the baselining mode of operation and the monitoring mode of operation. Additionally, during the baselining mode of operation, fault thresholds may be established (for example, fault thresholds may be established for different types of faults that may occur in an electrical machine). Learning of healthy behavior may refer to obtaining data that may characterize the behavior of a healthy electrical machine. Once the algorithm learns the healthy behavior of the electrical machine, the algorithm may then compute the one or more fault thresholds based on the learned healthy motor data. As described above, a fault threshold for a given type of fault may be based on a cluster of baseline data as illustrated in FIG. 5. The computed fault threshold(s) may be adaptive to specific electrical machines. Computing the fault threshold(s) may involve obtaining, using the data from the electrical machine in the frequency domain, peak and energy (which may refer to the area under the frequency plot within the bounds of the sum band) decibel (dB) values within an established sum band for a given type of fault (this process may be illustrated in further detail in FIG. 2), along with other associated electrical and thermal data. The sum band may refer to a range of frequency domain data that may be sampled in order to identify the peak and energy dB values for a given type of fault. That is, different types of faults may typically be associated with certain frequencies and/or frequency ranges, and a sum band may be a range of data points that may encompass the certain frequencies or frequency ranges. The sum band may be established to include a large enough range of frequencies so as to capture a sufficient number of data points around the frequency or frequency range typically associated with the type of fault, but not large enough as to capture other data points that may be irrelevant to the type of fault. In some cases, the size of the sum band (for example, the resolution of data capture) may vary for a given type of fault. This may be described in more detail with respect to FIG. 2 as well.

In some embodiments, outliers and covariance may also be established based on the sum band. Outliers may refer to extreme data points, and establishing such outliers may serve to eliminate extreme data points, or any points collected erroneously, so that any statistical computations on the data may not be impacted by the outliers. Covariance may help in checking if the data points are increasing or decreasing in the same direction so that they are varying as per the fault degradation progress. Those data points which are varying together represent better cluster formation.

In some embodiments, the algorithm may also involve a monitoring mode of operation that may take place once the baselining mode of operation is complete for a given electrical machine. During the monitoring mode, one or more fault indices may be calculated and compared to the one or more fault thresholds established during the baselining mode. That is, the protection relay may continue to capture data from the electrical machine in real-time, and may continue to determine peak and energy dB values in the frequency domain using the real-time data. Based on the comparison, it may be determined if one or more faults exist in the electrical machine. It may be determined that a fault exists, for example, if the fault index associated with a given type of fault is greater than the established threshold value for that type of fault. When a fault index goes beyond an established threshold value, an indication of the fault may be provided and/or an alarm may be triggered. In some cases, it may only be determined that a fault exists if the fault index is greater than the threshold value on a consistent basis (for example, if the fault index is greater than the threshold value a given number or times, or for a given length of time).

In some embodiments, if a fault is identified in a given electrical machine during the monitoring mode, an action may be taken. A first example action may include providing a notification to an operation in the form of an alarm, a warning, or any other type of notification. A second example action may include performing a change to the power system, such as turning off and/or on the electrical machine, or performing any other action with respect to the electrical machine and/or any other power asset in the system, such as repair, maintenance action, or a plan for a future maintenance action.

In some embodiments, the algorithm as described herein may include a number of benefits. For example, since the algorithm characterizes the behavior of a specific electrical machine, it may have high sensitivity of fault detection compared to traditional methods for VFD machines or machines having load oscillations. The algorithm may also enable operators to avoid setting any complex pickup, alarm and delay settings and may be adaptive to a specific electrical machine for which the algorithm is deployed. The algorithm may be computationally simple and built incrementally, so it may mitigate the large data requirements associated with machine learning algorithms (the machine learning algorithm may build the model incrementally by using live data captured from the electrical machine). The algorithm may also allow for fault thresholds to be established in across fleet of electrical machines as well (that is, thresholds may be established that may be applicable to multiple different electrical machines). That is, thresholds may be computed to machine-specific, but the range or boundaries of threshold values indicating fault maturity or component degradation may also be common across a fleet of machines. The algorithm may also be automated to relearn healthy electrical machine behavior when a hardware for the electrical machine is changed or repaired. Completion of learning process can be determined by the algorithm itself as well, whereas conventional algorithms may determine completion based on a threshold amount of time elapsing.

Figure 1:
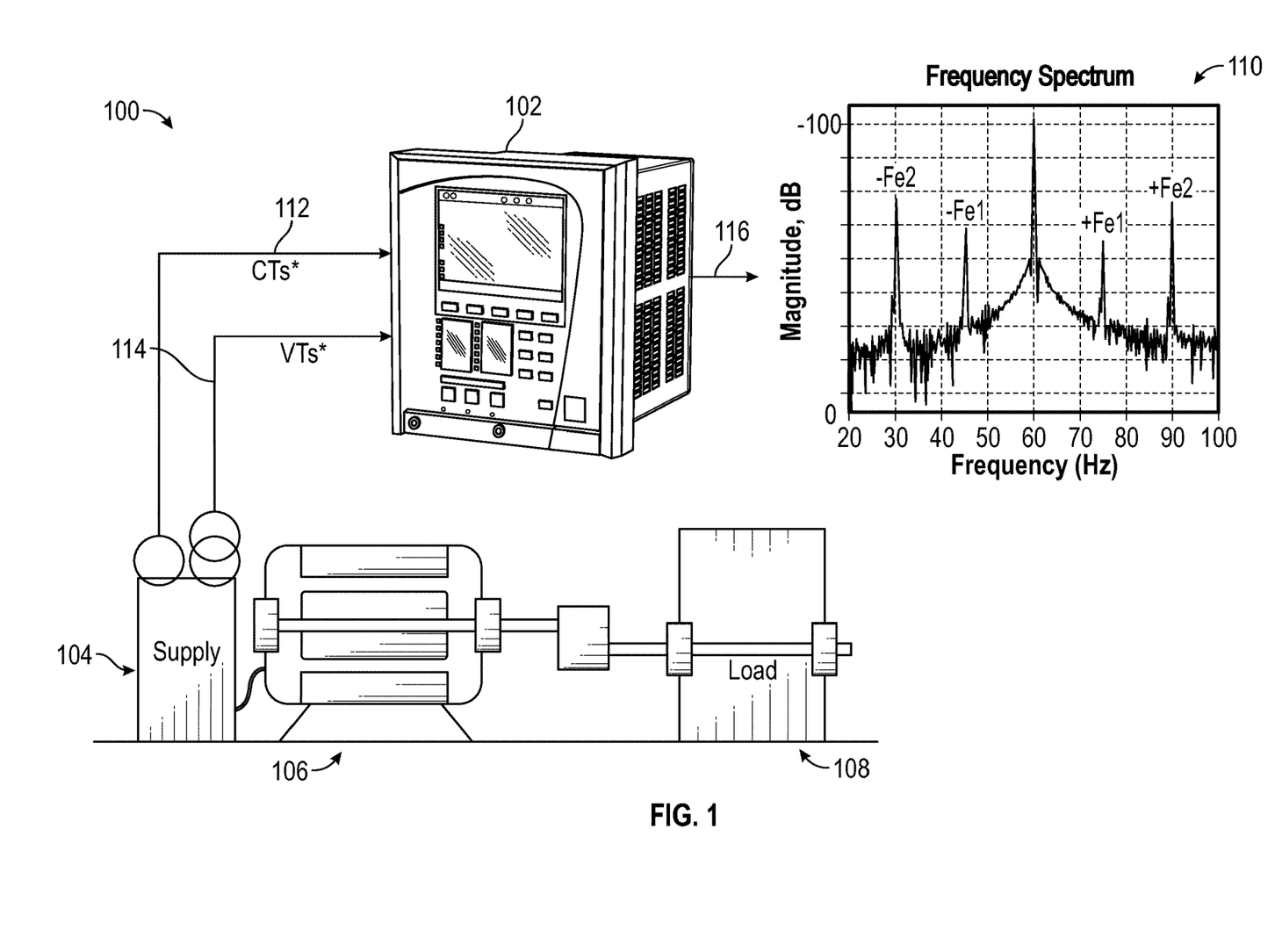
FIG. 1 depicts a schematic illustration of an example system, in accordance with one or more example embodiments of the disclosure.

Turning to the figures, FIG. 1 illustrates an example system 100 according to an embodiment of the disclosure. The system 100 may be a power system including one or more power assets. The one or more power assets may include at least a protection relay 102, a supply 104, an electrical machine 106, and/or a load 108. The protection relay may be an intelligent protection relay that may provide high performance protection, high density inputs and outputs (I/O), extensive programmable logic, and flexible configuration capabilities. With protection and control logic, such a protection relay 102 may allow for simplified coordination with upstream and downstream disconnect devices (e.g., one or more electrical machines 106 within the system 100). The protection relay 102 may itself also have the capability to monitor and capture data produced by the one or more electrical machines 106. It should be noted, however, that, in some cases, the algorithm may be implemented on a remote server instead of being implemented on a local device such as a protection relay 102. That is, data may be captured and transmitted to the remote server for analysis. In some cases, the data may be captured in the time domain and converted into the frequency domain for analysis (illustrated as frequency domain plot 110, which may be described in more detail with respect to FIG. 2). The supply 104 may be a power supply connected to the electrical machine 102 that may be used to provide power to the electrical machine 102. The electrical machine 106 may be, for example, an induction or synchronous motor, as well as any other type of electrical machine. In some cases, the electrical machine may specifically involve a variable frequency drive (VFD) motor. The load 108 may be any system that is powered by the electrical machine.

Figure 2:
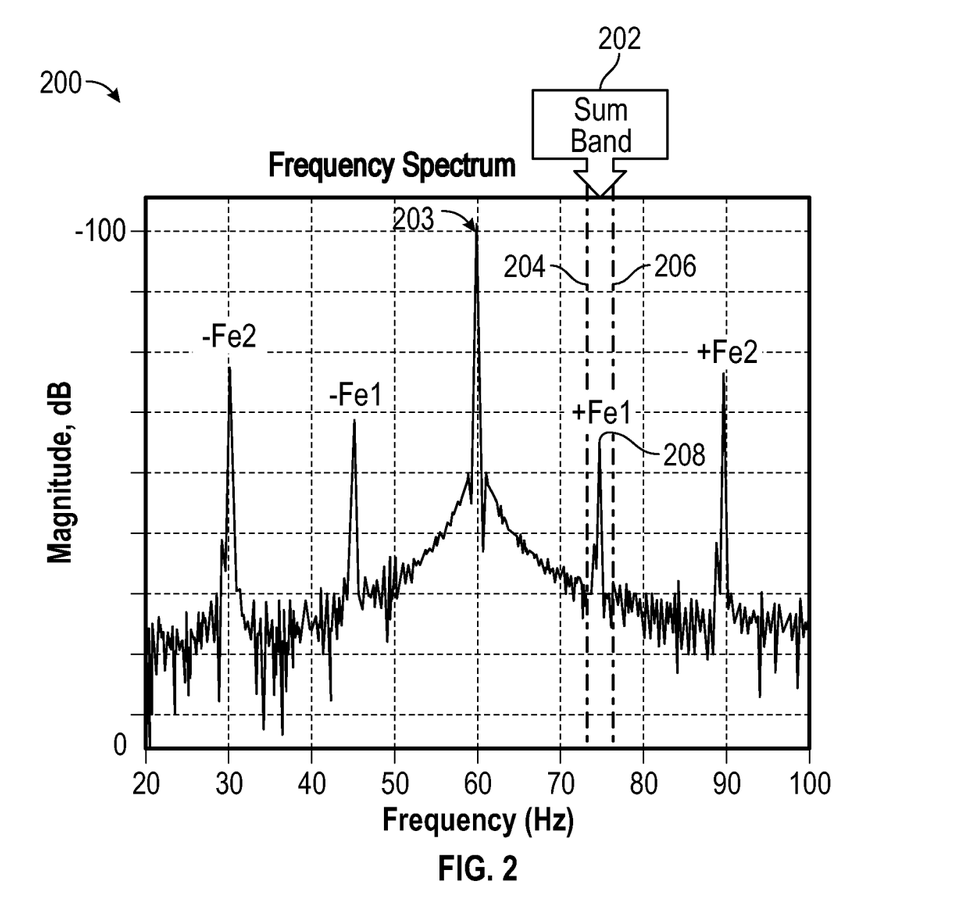
FIG. 2 depicts an example frequency domain plot, in accordance with one or more example embodiments of the disclosure.

FIG. 2 depicts an example frequency domain plot 200. The frequency domain plot 200 may illustrate an example of data (such as power or current magnitudes at various fault frequencies, for example) received from an electrical machine that has been converted into the frequency domain. The x-axis of the frequency domain plot 200 may include frequency values (which may be in hertz (Hz)), and the y-axis of the frequency domain plot 200 may include magnitude (which may be in decibels (dB)). That is, the magnitude of different frequency values may be depicted in the frequency domain plot 200. As mentioned above, the data may be captured by a protection relay, or similar device, such as the protection relay 102 described with respect to FIG. 1. The frequency domain plot 200 may include a fundamental frequency 203, which may be a fundamental frequency of the electrical machine (for example, electrical machine 106 or other electrical machine) from which the input data is captured. In the example frequency domain plot 200 depicted in the figure, the fundamental frequency of the electrical machine from which the input data is captured may be 60 Hz. The figure may also depict one or more additional fault frequencies (shown as −Fe2, −Fe1, +Fe1, +Fe2, etc.), which may be frequencies at which certain types of faults may be identified by the magnitude of the plot at that particular frequency. Although not depicted in the figure, the frequency domain data may be separated into one or more frequency bands, with each frequency band including a range of frequency values. In some cases, the frequency bands may include a "low frequency" band, a "medium frequency" band, and a "high frequency" band. For example, the low frequency band may include frequencies at or below 100 Hz, the medium frequency band may include frequencies between 100 Hz and 800 Hz, and the high frequency band may include frequencies above 800 Hz (this is just for example illustration). However, any other number of frequency bands including any range of frequencies may also be used. In some cases, different types of faults that the electrical machine may experience may typically fall within different frequency bands. For example, broken rotor bar and/or mechanical faults may typically fall within the low frequency band, bearing faults may typically fall within the medium frequency band, and stator faults may typically fall within the high frequency band. These may only be exemplary and any of the mentioned fault types and/or any other fault types may also fall within any other frequency band as well.

In some embodiments, the frequency domain plot 200 may also depict a sum band 202 including a lower bound 204 and an upper bound 206. The sum band 202 may refer to a range of frequency domain data that may be sampled in order to identify the peak and energy dB values for a given type of fault. That is, different types of faults may typically be associated with certain frequencies and/or frequency ranges, and a sum band 202 may be a range of data points that may encompass the certain frequencies or frequency ranges. The sum band 202 may be established to include a large enough range of frequencies so as to capture a sufficient number of data points around the frequency or frequency range typically associated with the type of fault, but not large enough as to capture other data points that may be irrelevant to the type of fault. In some instances, the size of the sum band (for example, the location of the lower bound 204 and the upper bound 206 relative to one another) may depend on the frequency band. In other words, the data resolution captured by the sum band may be dynamic and change based on the frequency band in which the sum band is created. In some cases, the size of the sum band 202 (the captured data resolution) may be increased for higher frequencies. As one non-limiting example, the data resolution in the medium frequency band may be twice that of the data resolution in the low frequency band. Continuing this non-limiting example, the data resolution in the high frequency band may be twice that of the data resolution in the medium frequency band. That is, more data points may be included in the medium frequency sum band 202 than the low frequency sum band 202, and more data points may be included in the high frequency sum band than the medium frequency sum band 202. In some embodiments, outliers and covariance may also be established based on the sum band. Outliers may refer to extreme data points, and establishing such outliers may serve to eliminate extreme data points, or any points collected erroneously, so that any statistical computations on the data may not be impacted by the outliers. Covariance may help in checking if the data points are increasing or decreasing in the same direction so that they are varying as per the fault degradation progress. Those data points which are varying together represent better cluster formation.

Figure 3:
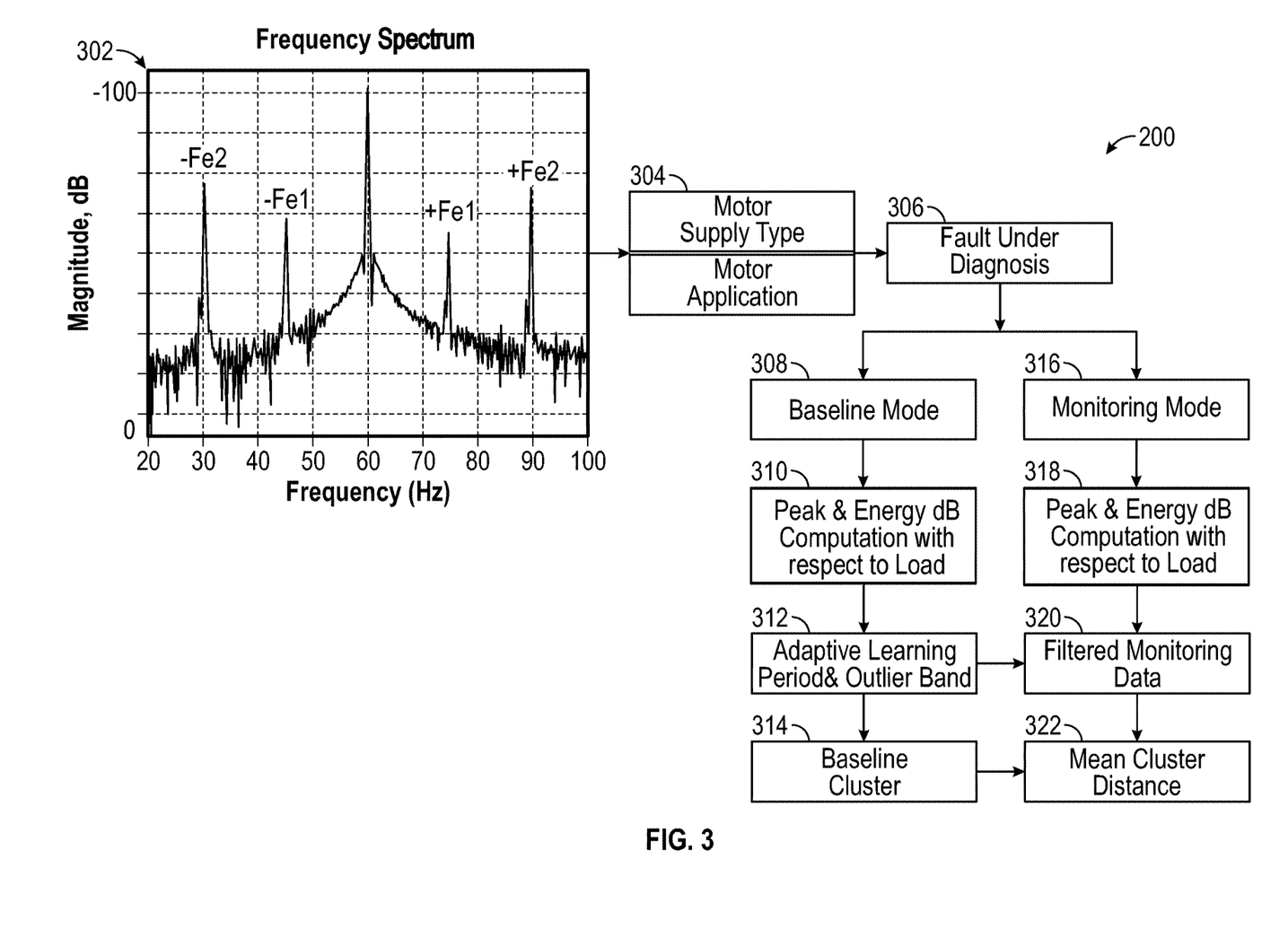
FIG. 3 depicts an example flow diagram, in accordance with one or more example embodiments of the disclosure.

FIG. 3 depicts an example flowchart 300. The flowchart 300 may be a high level illustration of operations involved in the electrical machine fault detection algorithm described herein. In some cases, the flowchart 300 may begin by supplying a fault analysis algorithm 306 (which may be implemented in a device local to a power system, such as the protection relay 102 described with respect to FIG. 1, a remote device, or any other type of device) with one or more inputs. In some cases, the one or more inputs may include data 302 captured from an electrical machine (such as the electrical machine 106 described with respect to FIG. 1 or any other electrical machine or number of electrical machines), as well as motor specific data 304, such as a motor supply type, and/or a motor application. The fault analysis algorithm 306 may involve a baselining mode of operation 308 and/or a monitoring mode of operation 316. In some cases, the baselining mode of operation 308 may take place before the monitoring mode of operation 316. The baselining mode of operation 308 may involve operation 310. Operation 310 may include peak and energy dB computations. The peak and energy dB computations may be performed in the frequency domain on data captured from the electrical machine in real-time. Following operation 310, the flowchart 300 may proceed to operation 312. Operation 312 may involve an adaptive learning period. The adaptive learning period, for example, may include performing baselining to establish one or more baseline thresholds for different types of faults that the electrical machine may experience (as mentioned above, these baselines may include data clusters as depicted in FIG. 5, for example). The baselining may be performed incrementally or adaptively based on real-time data capture. Additionally, operation 312 may involve establishing outliers. Operation 312 may involves adaptively deciding what should be the learning period based on the data being collected, and may also involve deciding outlier bands for the data within which only data may be accepted for computation during learning period or baseline mode. Following operation 312, the flowchart 300 may proceed to operation 314, which may involve establishing baseline data clusters that may be used to create fault thresholds. The fault thresholds may then be used during the monitoring mode of operation 316 to identify if the electrical machine is experiencing faults of different types. The same outlier bands identified during baseline mode may also be applied for filtering data during monitoring mode as well.

In some embodiments, following the baseline mode of operation 308, the flowchart 300 may begin the monitoring mode of operation 316. The monitoring mode of operation may begin with operation 318, which may also involve peak and energy dB computations. As with the baseline mode of operation 308, the peak and energy dB computations in the monitoring mode of operation 316 may be performed in the frequency domain on data captured from the electrical machine in real-time. Following operation 318, the flowchart 300 may proceed to operation 320, which may involve filtering data obtained during the monitoring mode of operation 316 (for example, using the outlier bands identified during the baselining mode). Following operation 320, the flowchart 300 may proceed to operation 322, Operation 322 may involve determining a distance between the data clusters obtained through the real-time data capturing during the monitoring mode of operation 316, and the baseline clusters (and corresponding thresholds) established during the baseline mode operation 308. The distance, for example, may be a Mahalanobis distance (MD) (or may be based on any other machine learning clustering-based technique) as illustrated in FIG. 5). Based on the distance, it may be determined if a fault exists in the electrical machine (for example, the distance may be used to determine if the data cluster obtained during the monitoring mode of operation 316 is beyond the threshold based on the data cluster obtained during the baselining mode of operation 308.

Figure 4:
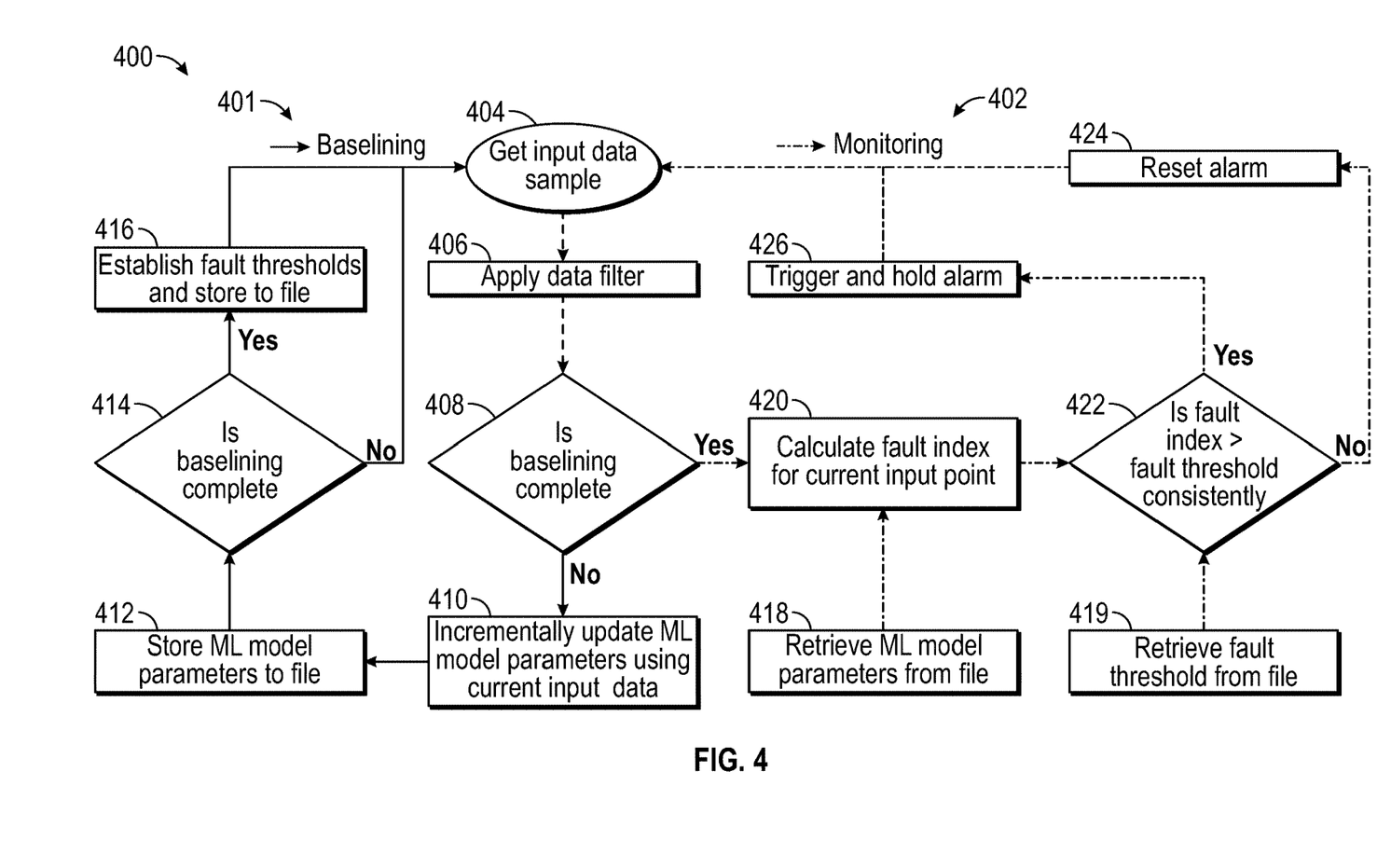
FIG. 4 depicts an example flow diagram, in accordance with one or more example embodiments of the disclosure.

FIG. 4 depicts an example flowchart 400 according to one embodiment of the disclosure. The flowchart 400 may be a flowchart that may expand on the flowchart 300 depicted in FIG. 3. The flowchart 400 may illustrate one or more operations performed during a baselining mode 401 and a monitoring mode 402. The baselining mode 401 may take place to capture data during "healthy" operations of an electrical machine that may be used to establish thresholds that subsequently may be used during the monitoring mode 402 to identify if any faults exist in the electrical machine. The data may be collected using the protection relay 102 described with respect to FIG. 1. The data captured during the baseline mode 401 and monitoring mode 402 may be real-time data, and may be used to establish data clusters using a machine learning clustering-based technique (for example, Mahalanobis distance (MD)).

In some embodiments, the flowchart 400 may begin at operation 404. Operation 404 may involve capturing input data. The input data may include, for example, frequency spectrum, temperature data from different sub-systems of machine, and computed electrical data such as current unbalance, rate of change in current frequency, power factor, etc. The flowchart 400 may then proceed to operation 406, which may involve applying a data filter. Following operation 406, the flowchart 400 may proceed to condition 408. Condition 408 may involve a determination as to whether the baselining is complete. If it is determined in condition 408 that baselining is complete, then the flowchart 400 may proceed to operation 420, which may be a part of monitoring mode 402. If it is determined in condition 408 that baselining is not complete, then the flowchart 400 may proceed to operation 410, which may be a part of the baselining mode 401. In some cases, it may be determined that the baseline mode of operation is completed based on a minimum number of data samples being collected, or based on the user configuration settings. Operation 410 may involve incrementally updating machine learning model parameters using current input data. For example, until the baseline period is completed or until the minimum number of data samples are collected, the machine learning model may be incrementally updated with new (current) data samples]. Following operation 410, the flowchart 400 may proceed to operation 412. Operation 412 may involve storing the machine learning model parameters. Machine learning model parameters may include machine learning model characteristics that may be learned based on the baseline data and type of model, and may indirectly represent baseline cluster details. Following operation 412, the flowchart 400 may proceed to condition 414. Condition 414 may involve a determination as to whether the baselining is complete. If it is determined in condition 414 that baselining is complete, then the flowchart 400 may proceed to operation 416. If it is determined in condition 414 that the baselining is not complete, then the flowchart 400 may return to operation 404. Operation 416 may involve establishing fault thresholds and/or storing the fault thresholds.

In some embodiments, once the baselining mode 401 is completed and the condition 408 is met, the flowchart 400 may proceed to operation 420, which may be an operation in the monitoring mode 402. That is, if it is determined that baselining is complete in condition 408, the flowchart 400 may transition from the baselining mode 401 to the monitoring mode 402. Operation 420 may involve calculating a fault index for a current input point. Operation 420 may be associated with operation 418, which may involve retrieving machine learning model parameters from storage. Machine learning model characteristics may be derived from baseline data is stored in a database, and the model may be retrieved for applying in the monitoring mode data. From operation 420, the flowchart may proceed to condition 422. Condition 422 may involve a determination as to whether the fault index is greater than the fault threshold. In some cases, it may only be determined that a fault exists if the fault index is greater than the threshold value on a consistent basis (for example, if the fault index is greater than the threshold value a given number or times, or for a given length of time). Condition 422 may also be associated with operation 419, which may involve retrieving fault thresholds from storage. If condition 422 is met, then the flowchart 400 may proceed to operation 426. If the condition 422 is not met, then the flowchart 400 may proceed to operation 424. Operation 426 may involve triggering an alarm. Operation 424 may involve resetting the alarm. Operation 426 may also involve any other action other than triggering an alarm as well. A second example action may include performing a change to the power system, such as turning off and/or on the electrical machine, or performing any other action with respect to the electrical machine and/or any other power asset in the system.

FIG. 5 depicts an example cluster plot 500. That is, the figure may depict an example of how a fault may be detected based on a baseline cluster of data produced by a machine learning clustering technique (for example, Mahalanobis distance). The cluster plot 500 may depict a first cluster 502 of baseline data. The baseline data may be data that is obtained during a baselining mode of the algorithm. That is, the baseline data may be associated with a healthy operation of the electrical machine at a frequency typically associated with a given type of electrical machine fault. Based on the baseline data, a threshold 504 may be established for determining when the particular type of fault has occurred in the electrical machine. The plot 500 may also depict a second cluster 508 and a third cluster 510. The second cluster 508 and the third cluster 510 may be data clusters captured during a monitoring mode of the algorithm. As depicted in the figure, the second cluster 508 may be within the threshold 504, but the third cluster 510 may be outside of the threshold. Thus, the second cluster 508 may be indicative of healthy operation of the electrical machine for the given type of fault, and the third cluster 510 may be indicative of the particular type of fault occurring in the electrical machine. In the example provided in FIG. 5, the clusters may be established using machine learning, so whether a cluster of data captured during the monitoring mode is within or outside of the threshold 504 may be determined using Mahalanobis distance (or any other similar method). In some embodiments, the Mahalanobis distance may be determined using Equation 1 provided below.

$$MD_n = \begin{pmatrix} energy_n \\ peak_n \end{pmatrix} - \begin{pmatrix} \overline{energy} \\ \overline{peak} \end{pmatrix}^T C^{-1} \begin{pmatrix} energy_n \\ peak_n \end{pmatrix} - \begin{pmatrix} \overline{energy} \\ \overline{peak} \end{pmatrix} \quad \text{(Equation 1)}$$

where $MD_n$ may be a squared Mahalanobis distance for a given sample, n, $energy_n$ may be an energy at a sample, n, $peak_n$ may be a peak at a sample, n, $\overline{energy}$ may be a mean of baseline energy as may be computed using Equation 2, $\overline{peak}$ may be a mean of baseline peak as may be computed using Equation 3, and $C^{-1}$ may be an inverse of a covariance matrix as may be computed using Equations 4-5.

$$\overline{energy}_n = \overline{energy}_{n-1} + \frac{energy_n - \overline{energy}_{n-1}}{n} \quad \text{(Equation 2)}$$

$$\overline{peak}_n = \overline{peak}_{n-1} + \frac{peak - \overline{peak}_{n-1}}{n} \quad \text{(Equation 3)}$$

$$Cov_n(energy, peak) = \left[Cov_{n-1}(energy, peak) * \frac{n-1}{n}\right] + \quad \text{(Equation 4)}$$
$$\left[\frac{1}{n-1}(energy_n - \overline{energy}_n * (peak_n - \overline{peak}_n)\right]$$

$$C(energy, peak) = \begin{bmatrix} Cov(energy, energy) & Cov(energy, peak) \\ Cov(peak, energy) & Cov(peak, peak) \end{bmatrix} \quad \text{(Equation 5)}$$

Figure 6:
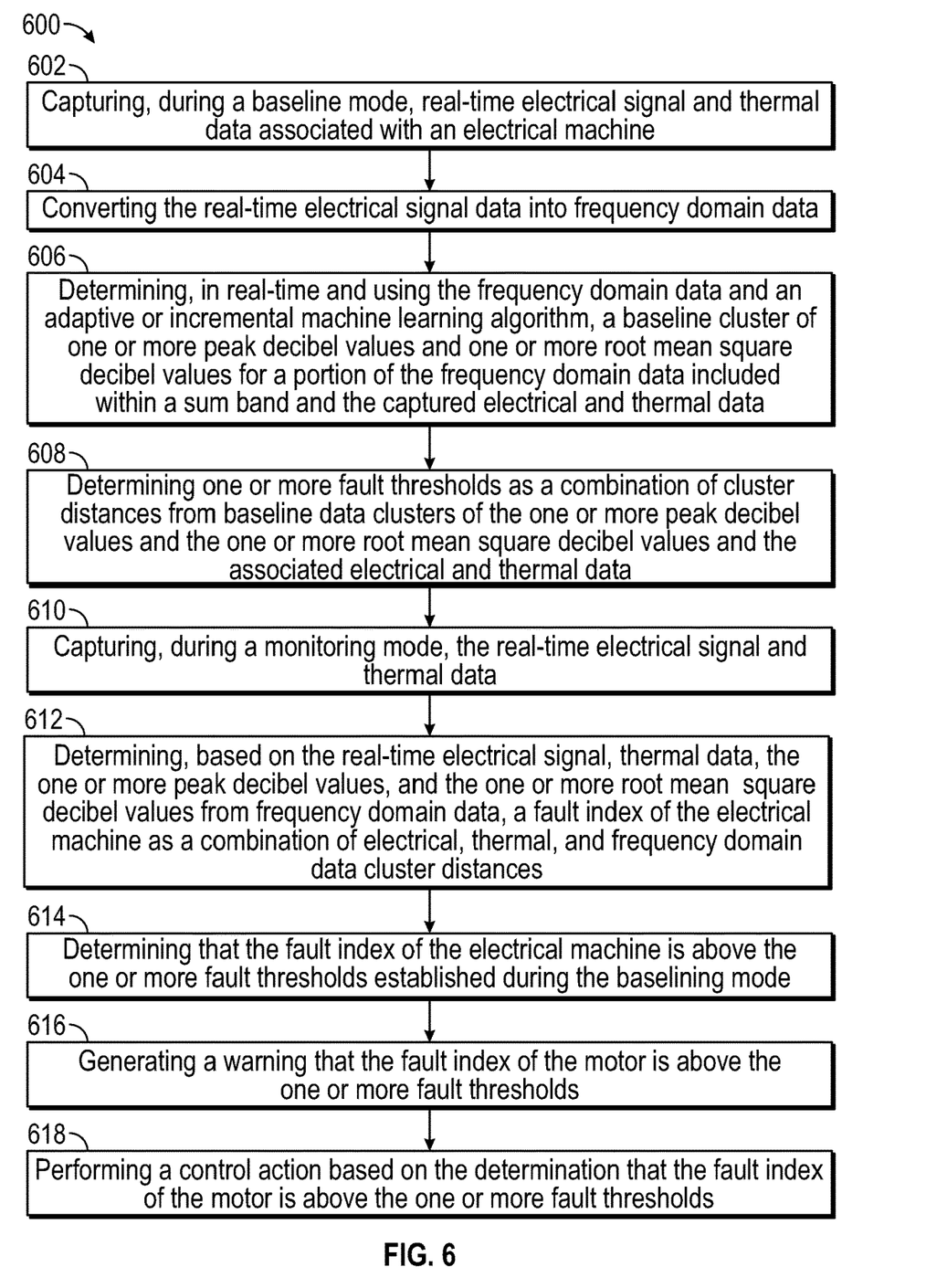
FIG. 6 depicts an example method, in accordance with one or more example embodiments of the disclosure.

FIG. 6 depicts an example method 600 according to an example embodiment of the disclosure. At block 602 in FIG. 6, the method 600 may include capturing, during a baseline mode, real-time electrical signal and thermal data associated with an electrical machine. Block 604 of the method 600 may include converting the real-time electrical signal data into frequency domain data. determining, in real-time and using the frequency domain data and an adaptive or incremental machine learning algorithm, a baseline cluster of one or more peak decibel values and one or more root mean square decibel values for a portion of the frequency domain data included within a sum band and the captured electrical and thermal data. Block 606 of the method 600 may determining one or more fault thresholds as a combination of cluster distances from baseline data clusters of the one or more peak decibel values and the one or more root mean square decibel values and the associated electrical and thermal data. Block 608 of the method 600 may capturing, during a monitoring mode, the real-time electrical signal and thermal data. Block 610 of the method 600 may determining, based on the real-time electrical signal, thermal data, the one or more peak decibel values, and the one or more root mean square decibel values from frequency domain data, a fault index of the electrical machine as a combination of electrical, thermal, and frequency domain data cluster distances. Block 612 of the method 600 may determining that the fault index of the electrical machine is above the one or more fault thresholds established during the baselining mode. Block 614 of the method 600 may generating a warning that the fault index of the motor is above the one or more fault thresholds. Block 616 of the method 600 may performing a control action based on the determination that the fault index of the motor is above the one or more fault thresholds.

In some embodiments, the method 600 may also include determining a number of frequency values to include in the sum band based on a magnitude of the frequency values. The method 600 may also include determining a covariance matrix using the one or more peak decibel values and one or more root mean square decibel values and the associated electrical and thermal data. The method 600 may also include performing outlier filtering of the frequency domain data included within the sum band based on at least one of: a magnitude of the frequencies included within the sum band, a supply or load type of the electrical machine, application of the electrical machine, or presence of load oscillations.

In some embodiments, the frequency domain data is separated into a low range of frequency values, a medium range of frequency values, and a high range of frequency values, and the method further comprises determining a number of frequency values to include in the sum band based on a magnitude of the frequency values, wherein the number of frequency values included in the sum band is larger in the medium range of frequency values than the low range of frequency values, and is larger in the high range of frequency values than the medium range of frequency values. In some embodiments, determining one or more fault thresholds is further based on electrical machine-specific characteristics, such as nameplate information, design data, supply or load conditions, age and condition of the electrical machine during baseline period, or a frequency zone of a fault under diagnosis. In some embodiments, the fault thresholds are established as a normalized distance from a baseline cluster of one or more peak decibel values and one or more root mean square decibel values, and the associated electrical and thermal data and wherein the fault thresholds apply to multiple different electrical machines in a fleet of electrical machines. In some embodiments, the machine learning algorithm includes any clustering based technique.

In some embodiments, the electrical machine is a variable-frequency drive (VFD) machine. In some embodiments, determining the baseline cluster of one or more peak decibel values and one or more root mean square decibel values and the associated electrical and thermal data is performed with storage of historical data.

The operations described and depicted in the illustrative process flow of FIGS. 2 and 4-5 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 2 and 4-5 may be performed.

Figure 7:
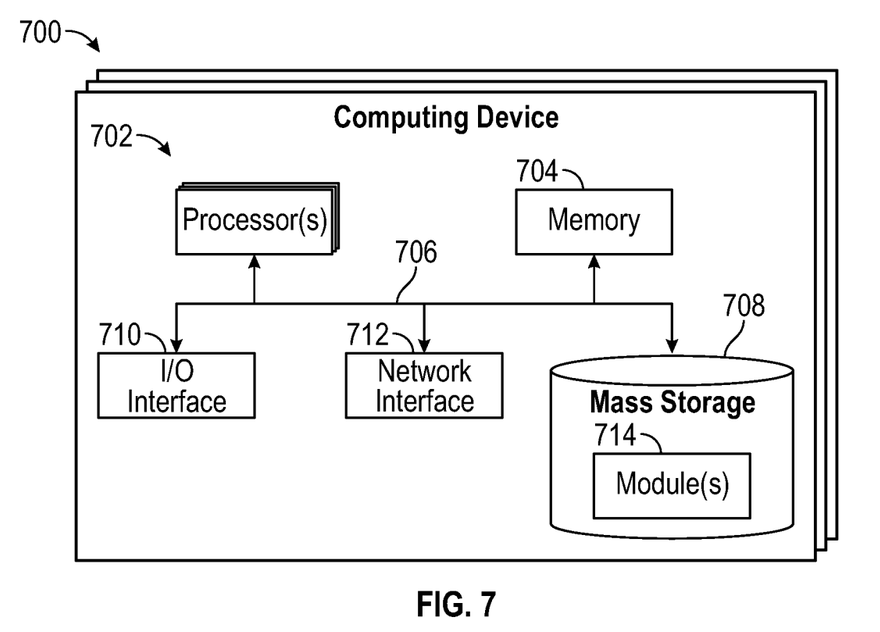
FIG. 7 depicts a schematic illustration of an example computing system and device architecture, in accordance with one or more example embodiments of the disclosure.

FIG. 7 illustrates an example computing system and device 700, in accordance with one or more embodiments of this disclosure. The computing device 700 may be representative of any number of elements described herein, such the protection relay 102, or any other element described herein. The computing device 700 may include one or more processors 702 that execute instructions that are stored in one or more memory devices (referred to as memory 704). The instructions can be, for instance, instructions for implementing functionality described as being carried out by one or more modules and systems disclosed above or instructions for implementing one or more of the methods disclosed above. The one or more processors 702 can be embodied in, for example, a CPU, multiple CPUs, a GPU, multiple GPUs, a TPU, multiple TPUs, a multi-core processor, a combination thereof, and the like. In some embodiments, the one or more processors 702 can be arranged in a single processing device. In other embodiments, the one or more processors 702 can be distributed across two or more processing devices (e.g., multiple CPUs; multiple GPUs; a combination thereof; or the like). A processor can be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit (IC), an ASIC, a digital signal processor (DSP), an FPGA, a PLC, a complex programmable logic device (CPLD), a discrete gate or transistor logic, discrete hardware components, or any combination thereof designed or otherwise configured (e.g., manufactured) to perform the functions described herein.

The one or more processors 702 can access the memory 704 by means of a communication architecture 706 (e.g., a system bus). The communication architecture 706 may be suitable for the particular arrangement (localized or distributed) and types of the one or more processors 702. In some embodiments, the communication architecture 706 can include one or many bus architectures, such as a memory bus or a memory controller; a peripheral bus; an accelerated graphics port; a processor or local bus; a combination thereof, or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and/or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read-only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 704 also can retain data.

Each computing device 700 also can include mass storage 708 that is accessible by the one or more processors 702 by means of the communication architecture 706. The mass storage 708 can include machine-accessible instructions (e.g., computer-readable instructions and/or computer-executable instructions). In some embodiments, the machine-accessible instructions may be encoded in the mass storage 708 and can be arranged in components that can be built (e.g., linked and compiled) and retained in computer-executable form in the mass storage 708 or in one or more other machine-accessible non-transitory storage media included in the computing device 700. Such components can embody, or can constitute, one or many of the various modules disclosed herein. Such modules are illustrated as modules 714. Additionally, protocols such as Modbus, DNP, IEC 60870, IEC 61850, Profibus, Fieldbus, etc. may be used in conjunction with the systems and methods described herein.

Execution of the asset monitoring and diagnostic modules 714, individually or in combination, by the one more processors 702, can cause the computing device 700 to perform any of the operations described herein (for example, the operations described with respect to FIGS. 3-4 and 6, as well as any other operations).

Each computing device 700 also can include one or more input/output interface devices 710 (referred to as I/O interface 710) that can permit or otherwise facilitate external devices to communicate with the computing device 700. For instance, the I/O interface 710 may be used to receive and send data and/or instructions from and to an external computing device.

The computing device 700 also includes one or more network interface devices 712 (referred to as network interface(s) 712) that can permit or otherwise facilitate functionally coupling the computing device 700 with one or more external devices. Functionally coupling the computing device 700 to an external device can include establishing a wireline connection or a wireless connection between the computing device 700 and the external device. The network interface(s) 712 can include one or many antennas and a communication processing device that can permit wireless communication between the computing device 700 and another external device. For example, between a vehicle and a smart infrastructure system, between two smart infrastructure systems, etc. Such a communication processing device can process data according to defined protocols of one or several radio technologies. The radio technologies can include, for example, 3G, Long Term Evolution (LTE), LTE-Advanced, 5G, IEEE 802.11, IEEE 802.16, Bluetooth, ZigBee, near-field communication (NFC), and the like. The communication processing device can also process data according to other protocols as well, such as vehicle-to-infrastructure (V2I) communications, vehicle-to-vehicle (V2V) communications, and the like. The network interface(s) 712 may also be used to facilitate peer-to-peer ad-hoc network connections as described herein.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module can be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules can communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module can be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still, in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electromechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

What has been described herein in the present specification and annexed drawings includes examples of systems, devices, techniques, and computer program products that, individually and in combination, permit the automated provision of an update for a vehicle profile package. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

That which is claimed is:

1. A system comprising:
an electrical machine; and
a computer processor operable to execute a set of computer-readable instructions; and a memory operable to store the set of computer-readable instructions operable to:
capture, during a baseline mode, real-time electrical signal data and thermal data associated with the electrical machine;
convert the real-time electrical signal data into frequency domain data;
determine, in real-time and using the frequency domain data and an adaptive or incremental machine learning algorithm, a baseline cluster of one or more peak decibel values and one or more root mean square decibel values for a portion of the frequency domain data included within a sum band and the captured electrical and thermal data;
determine one or more fault thresholds as a combination of cluster distances from baseline data clusters of the one or more peak decibel values and the one or more root mean square decibel values and the associated electrical and thermal data;
capture, during a monitoring mode, the real-time electrical signal and thermal data;
determine, based on the real-time electrical signal, thermal data, the one or more peak decibel values, and the one or more root mean square decibel values from frequency domain data, a fault index of the electrical machine as a combination of electrical, thermal, and frequency domain data cluster distances;
determine that the fault index of the electrical machine is above the one or more fault thresholds established during the baselining mode;
generate a warning that the fault index of the electrical machine is above the one or more fault thresholds; and
perform a control action based on the determination that the fault index of the electrical machine is above the one or more fault thresholds;
wherein the fault thresholds are established as a normalized distance from a baseline cluster of one or more peak decibel values and one or more root mean square decibel values, and the associated electrical and thermal data and wherein the fault thresholds apply to multiple different electrical machines in a fleet of electrical machines.

2. The system of claim 1, wherein the processor is further configured to determine a number of frequency values to include in the sum band based on a magnitude of the frequency values.

3. The system of claim 1, wherein the frequency domain data is separated into a low range of frequency values, a medium range of frequency values, and a high range of frequency values, and the processor is further configured to determine a number of frequency values to include in the sum band based on a magnitude of the frequency values, wherein the number of frequency values included in the sum band is larger in the medium range of frequency values than the low range of frequency values, and is larger in the high range of frequency values than the medium range of frequency values.

4. The system of claim 1, wherein the processor is further configured to determine a covariance matrix using the one or more peak decibel values and one or more root mean square decibel values and the associated electrical and thermal data.

5. The system of claim 1, wherein the processor is further configured to perform outlier filtering of the frequency domain data included within the sum band based on at least one of: a magnitude of the frequencies included within the sum band, a supply or load type of the electrical machine, application of the electrical machine, or presence of load oscillations.

6. The system of claim 1, wherein determining one or more fault thresholds is further based on electrical machine-specific characteristics, such as nameplate information, design data, supply or load conditions, age and condition of the electrical machine during baseline period, or a frequency zone of a fault under diagnosis.

7. The system of claim 1, wherein the machine learning algorithm includes any clustering based technique.

8. The system of claim 1, wherein the electrical machine is a variable-frequency drive (VFD) machine.

9. The system of claim 1, wherein determining the baseline cluster of one or more peak decibel values and one or more root mean square decibel values and the associated electrical and thermal data is performed with storage of historical data.

10. A method comprising:
capturing, during a baseline mode, real-time electrical signal data and thermal data associated with an electrical machine;
converting the real-time electrical signal data into frequency domain data;
determining, in real-time and using the frequency domain data and an adaptive or incremental machine learning algorithm, a baseline cluster of one or more peak decibel values and one or more root mean square decibel values for a portion of the frequency domain data included within a sum band and the captured electrical and thermal data;
determining one or more fault thresholds as a combination of cluster distances from baseline data clusters of the one or more peak decibel values and the one or more root mean square decibel values and the associated electrical and thermal data;
capturing, during a monitoring mode, the real-time electrical signal and thermal data;
determining, based on the real-time electrical signal, thermal data, the one or more peak decibel values, and the one or more root mean square decibel values from frequency domain data, a fault index of the electrical machine as a combination of electrical, thermal, and frequency domain data cluster distances;
determining that the fault index of the electrical machine is above the one or more fault thresholds established during the baselining mode;
generating a warning that the fault index of the electrical machine is above the one or more fault thresholds; and
performing a control action based on the determination that the fault index of the electrical machine is above the one or more fault thresholds;
wherein the frequency domain data is separated into a low range of frequency values, a medium range of frequency values, and a high range of frequency values, and the method further comprises determining a number of frequency values to include in the sum band based on a magnitude of the frequency values, wherein the number of frequency values included in the sum band is larger in the medium range of frequency values than the low range of frequency values, and is larger in the high range of frequency values than the medium range of frequency values.

11. The method of claim 10, further comprising determining a number of frequency values to include in the sum band based on a magnitude of the frequency values.

12. The method of claim 10, further comprising determining a covariance matrix using the one or more peak decibel values and one or more root mean square decibel values and the associated electrical and thermal data.

13. The method of claim 10, further comprising performing outlier filtering of the frequency domain data included within the sum band based on at least one of: a magnitude of the frequencies included within the sum band, a supply or load type of the electrical machine, application of the electrical machine, or presence of load oscillations.

14. The method of claim 10, wherein determining one or more fault thresholds is further based on electrical machine-specific characteristics, such as nameplate information, design data, supply or load conditions, age and condition of the electrical machine during baseline period, or a frequency zone of a fault under diagnosis.

15. The method of claim 10, wherein the fault thresholds are established as a normalized distance from a baseline cluster of one or more peak decibel values and one or more root mean square decibel values, and the associated electrical and thermal data and wherein the fault thresholds apply to multiple different electrical machines in a fleet of electrical machines.

16. The method of claim 10, wherein the machine learning algorithm includes any clustering based technique.

17. The method of claim 10, wherein the electrical machine is a variable-frequency drive (VFD) machine.

18. The method of claim 10, wherein determining the baseline cluster of one or more peak decibel values and one or more root mean square decibel values and the associated electrical and thermal data is performed with storage of historical data.

* * * * *